United States Patent
Bexten

[11] Patent Number: 6,062,239
[45] Date of Patent: May 16, 2000

[54] CROSS FLOW CENTRIFUGAL PROCESSOR

[75] Inventor: Daniel P. Bexten, Kalispell, Mont.

[73] Assignee: Semitool, Inc., Kalispell, Mont.

[21] Appl. No.: 09/108,162

[22] Filed: Jun. 30, 1998

[51] Int. Cl.[7] ................................. B08B 9/20
[52] U.S. Cl. .................. 134/25.4; 134/157; 134/148; 134/30
[58] Field of Search ................... 134/163, 157, 134/148, 902, 102.3, 95.2, 25.4, 30

[56] References Cited

U.S. PATENT DOCUMENTS

| | | |
|---|---|---|
| Re. 28,135 | 8/1974 | Hull . |
| 193,222 | 7/1877 | Buell . |
| 556,358 | 3/1896 | Maxfeild ............................... 134/163 |
| 910,882 | 1/1909 | Truesdell . |
| 1,035,480 | 8/1912 | Schodde . |
| 1,049,896 | 1/1913 | Miller ................................. 134/163 |
| 1,069,673 | 8/1913 | Charles ................................ 134/163 |
| 1,405,243 | 1/1922 | Wing . |
| 1,590,470 | 6/1926 | Means .................................. 134/163 |
| 1,793,798 | 2/1931 | Harker . |
| 2,141,713 | 12/1938 | Hwnsler et al. ........................ 134/163 |
| 2,225,501 | 12/1940 | Lapham et al. . |
| 2,234,878 | 3/1941 | Ross ................................... 134/163 |
| 2,267,580 | 12/1941 | Turner ................................. 134/163 |
| 2,563,046 | 8/1951 | Killin ................................. 134/163 |
| 2,573,128 | 10/1951 | Cavicchioli . |
| 2,675,012 | 4/1954 | Scales . |
| 2,677,381 | 5/1954 | Fisher . |
| 2,684,585 | 7/1954 | Smith . |
| 2,721,566 | 10/1955 | Brucker . |
| 3,079,286 | 2/1963 | Kearney et al. . |
| 3,116,744 | 1/1964 | Hager . |
| 3,203,434 | 8/1965 | Kipp et al. . |
| 3,214,026 | 10/1965 | Behrens . |
| 3,242,934 | 3/1966 | Heinicke et al. . |
| 3,341,016 | 9/1967 | Paasche . |
| 3,383,255 | 5/1968 | Rossi et al. . |
| 3,443,567 | 5/1969 | Moore . |
| 3,464,429 | 9/1969 | Ehrhardt . |
| 3,489,608 | 1/1970 | Jacobs et al. . |
| 3,526,237 | 9/1970 | Neill, Jr. . |
| 3,585,128 | 6/1971 | Hoffman . |
| 3,585,668 | 6/1971 | Jaccodine et al. . |
| 3,608,567 | 9/1971 | Neill, Jr. . |
| 3,643,671 | 2/1972 | Henninges et al. . |
| 3,664,872 | 5/1972 | Frank et al. . |
| 3,727,620 | 4/1973 | Orr . |

(List continued on next page.)

FOREIGN PATENT DOCUMENTS

| | | |
|---|---|---|
| 133661 | 7/1949 | Australia ............................. 134/163 |
| 0 292 090 | 11/1988 | European Pat. Off. . |
| 1477965 | 6/1969 | Germany . |
| 3815018 | 12/1988 | Germany . |
| 684287 | 3/1965 | Italy .................................. 134/163 |
| 61-164226 | 7/1986 | Japan . |
| 1111338 | 4/1989 | Japan . |
| 73226 | 3/1948 | Norway ............................... 134/163 |
| 1235504 | 6/1971 | United Kingdom .................... 134/163 |

OTHER PUBLICATIONS

Mathisen; IBM Tech. Disclosure Bulletin, vol. 10, No. 3 Aug. 1967; Etch Control Probe, pp. 193 & 194.

Takeshi Hattori et al.; Microcontamination, vol. 9, No. 12; Introducing A New PFA Wafer–Carrier Cleaning Technology; Dec. 1991; pp. 17–21.

*Primary Examiner*—Frankie L. Stinson
*Attorney, Agent, or Firm*—Lyon & Lyon LLP

[57] ABSTRACT

A centrifugal processor for processing flat media, such as silicon wafers, has a rotor rotatably mounted within a rotor housing. Fan blades on the rotor blow air over the wafers, to move any remaining fluid droplets away from the wafer centers, to allow centrifugal force to fling the fluid droplets off of the wafers. The centrifugal processor uses clean room air, rather than nitrogen, for drying. Operating costs are reduced while manufacturing yields are increased, as spotting at the wafer centers is avoided.

23 Claims, 4 Drawing Sheets

U.S. PATENT DOCUMENTS

| | | |
|---|---|---|
| 3,748,677 | 7/1973 | Frank et al. . |
| 3,756,410 | 9/1973 | Moody et al. . |
| 3,760,822 | 9/1973 | Evans . |
| 3,769,992 | 11/1973 | Wallestad . |
| 3,804,758 | 4/1974 | Cooper et al. . |
| 3,808,065 | 4/1974 | Robinson et al. . |
| 3,853,622 | 12/1974 | Rutten . |
| 3,939,514 | 2/1976 | Cook . |
| 3,964,957 | 6/1976 | Walsh . |
| 3,970,471 | 7/1976 | Bankes et al. . |
| 3,990,462 | 11/1976 | Elftmann et al. . |
| 4,027,686 | 6/1977 | Shortes et al. . |
| 4,077,416 | 3/1978 | Johnson, Jr. et al. . |
| 4,092,176 | 5/1978 | Kozai et al. . |
| 4,132,567 | 1/1979 | Blackwood . |
| 4,208,760 | 6/1980 | Dexter et al. . |
| 4,226,642 | 10/1980 | Baran . |
| 4,286,541 | 9/1981 | Blackwood . |
| 4,300,581 | 11/1981 | Thompson . |
| 4,370,992 | 2/1983 | Choudhury et al. . |
| 4,440,185 | 4/1984 | Wiltse . |
| 4,456,022 | 6/1984 | Roberts . |
| 4,458,703 | 7/1984 | Inoue et al. . |
| 4,523,764 | 6/1985 | Albers et al. . |
| 4,536,845 | 8/1985 | DeVale et al. . |
| 4,571,850 | 2/1986 | Hunt et al. . |
| 4,682,614 | 7/1987 | Silvernail et al. . |
| 4,693,017 | 9/1987 | Oehler et al. . |
| 4,694,527 | 9/1987 | Yoshizawa . |
| 4,731,154 | 3/1988 | Hazlitt et al. . |
| 4,745,422 | 5/1988 | Matsuoka et al. . |
| 4,750,505 | 6/1988 | Inuta et al. . |
| 4,753,258 | 6/1988 | Seiichiro . |
| 4,788,994 | 12/1988 | Shinbara . |
| 4,828,660 | 5/1989 | Clark et al. . |
| 4,871,417 | 10/1989 | Nishizawa et al. . |
| 4,903,717 | 2/1990 | Sumnitsch . |
| 4,907,349 | 3/1990 | Aigo . |
| 4,941,489 | 7/1990 | Kamimura et al. . |
| 4,982,215 | 1/1991 | Matsuoka . |
| 4,982,753 | 1/1991 | Grebinski, Jr. et al. . |
| 5,000,208 | 3/1991 | Ludwig et al. . |
| 5,027,841 | 7/1991 | Breunsbach et al. . |
| 5,069,236 | 12/1991 | Pierson . |
| 5,211,743 | 5/1993 | Swain ..................................... 134/902 |
| 5,361,449 | 11/1994 | Akimoto . |
| 5,562,113 | 10/1996 | Thompson et al. .................... 134/95.2 |
| 5,706,843 | 1/1998 | Matsuo ................................... 134/902 |

CROSS FLOW CENTRIFUGAL PROCESSOR

BACKGROUND OF THE INVENTION

The field of the invention is centrifugal processors used in manufacturing flat media products.

The production of semiconductor wafers, substrates and photomask plates used in the manufacture of semiconductor wafers, has typically utilized processing equipment in which various types of processing fluids are used to treat the wafers. One example of a semiconductor processor is a centrifugal rinser-dryer used to rinse acids, caustics, etchants and other processing fluids from wafers, photomask plates, and similar units. The rinser-dryers are also used to dry the rinsed units using a flow of heated gas, such as nitrogen which is passed through the processing chamber after rinsing with the desired fluid. The wafers are spun during processing to provide more even distribution of the processing fluids across the wafer surfaces, and to assist in removal of rinsing liquids in preparation for drying.

Other types of semiconductor processors include acid and caustic treatment machines which spray or otherwise apply acids and caustics to the wafers or other flat media. Stripping processors are used to remove photoresist from the wafers. Other specific processing of semiconductors may require other types of chemicals. Many of these processes are appropriately performed in centrifugal processing machines to provide for even distribution of fluids over the wafer and to aid in removal of liquids.

A primary problem in the production of semiconductors is particle contamination. Contaminant particles can affect the photographic processes used to transfer the chip layouts onto the wafers being processed into chips. Contaminants on the photomasks can cause deterioration of the image being transferred onto the wafer. The direct processing of the wafers or other flat media themselves is even more susceptible to contamination because of the numerous processing steps, and the risk at each stage that contaminating particles can become adhered to the surface of the wafer. Particle contamination typically causes a large number of the chips in a wafer to be defective. Thus it is very important to reduce contamination to increase yields.

With higher resolution now made possible through newer semiconductor processing techniques, the effects of contaminants has become even more of a problem than in the past. In the past, contaminant particles smaller than 1 micron did not cause defects as minimum feature sizes were 2 microns or larger. However, now the feature size used in high density chip designs is substantially smaller, e.g., 0.18 micron. Planning is already progressing for even higher density chips which require even smaller feature sizes. The move toward smaller feature sizes is compounding the contamination problem because of the greater difficulty in controlling smaller particles and the greater numbers of smaller particles in the processing environment. If contaminants are present, then substantial numbers of the resulting chips can be rendered defective and unusable, at substantial cost to the manufacturer.

The causes of contaminating particles on wafer surfaces occurs from numerous sources. Each of the processing chemicals used is necessarily impure to some small degree. The water used in processing is deionized to remove metallic ions and other impurities, but such supplies also contain some impurities. Environmental dust carried in the air in which the wafer is moved between the various processing machines also causes contamination. To reduce this environmental contamination, manufacturers of semiconductors have built production areas which have relatively low amounts of environmental dust. These so-called "clean rooms" are extremely expensive to build and expensive to operate in a manner which maintains contaminant particle levels at acceptable low levels. With the decrease in feature size to provide more dense chips, the difficulties in providing sufficiently low environmental dust levels have increased.

Contamination near the center of the wafers has been a long standing problem associated with centrifugal processing machines. The centrifugal forces acting on the fluid droplets on a wafer are directly proportional to the distance between the fluid droplet and the spin axis of the wafer. Consequently, the centrifugal force acting on fluid droplets at or near the spin axis may be insufficient to fling the droplets off of the wafers. As a result, semiconductor chips which are subsequently formed on the wafers at or near the spin axis, will often be defective, because of impurities left there by "spotting", i.e., removal of a fluid droplet by evaporation, rather than by centrifugal force.

Centrifugal processors are installed in clean rooms, along with other semiconductor processing equipment, to minimize contamination of the wafers. Due to the cost and complexities of clean room installations and operations, the centrifugal processors are necessarily compact. The wafers, which are e.g., 200 mm in diameter, are spaced apart by only a few millimeters within the centrifugal processor. As a result, there is little air or gas flow across the centers of the wafers. Some existing centrifugal processors spray dry nitrogen across the wafers. See, for example, U.S. Pat. Nos. 5,022,419 and 4,300,581, incorporated herein by reference. While spraying dry nitrogen across the wafers, to remove droplets at or near the wafer centers, is effective, it consumes large amounts of nitrogen, at a significant cost. Accordingly, difficulties remain in achieving cost effective high production yields in manufacturing semiconductors and other flat media. It is therefore an object of the invention to provide an improved centrifugal processor for processing flat media, such as silicon wafers.

SUMMARY OF THE INVENTION

The present invention is directed to a centrifugal processor designed to better remove fluid droplets from central areas of flat media or wafers. By doing so, higher manufacturing yields are achieved. In a first separate aspect of the invention, a centrifugal processor includes a rotor within a rotor housing. Preferably, fan blades on the rotor blow air across wafers within the rotor, to displace fluid droplets remaining near the centers of the wafers.

In a second separate aspect of the invention, clean room air is advantageously drawn into the rotor housing, blown over the wafers, and then exhausted back into the clean room, eliminating the need to use nitrogen or other gas for drying.

In a third separate aspect of the invention, the rotor is closely surrounded by a rotor housing. Air flow is therefore directed in part to blow over the wafers, including central areas of the wafers.

In a fourth separate aspect of the invention, one or more of the foregoing separate aspects are combined to enhance removal of droplets from central areas of the wafers or other flat media.

BRIEF DESCRIPTION OF THE DRAWINGS

Other objects and features of the invention will become apparent from the following detailed description and drawings. It should be understood, however, that the drawings are designed for the purpose of illustration only, and are not intended as a definition of the limits of the invention.

In the drawings, wherein the same reference numbers denote the same elements throughout the several views.

DETAILED DESCRIPTION OF THE PREFERRED EMBODIMENT

Figure 1:
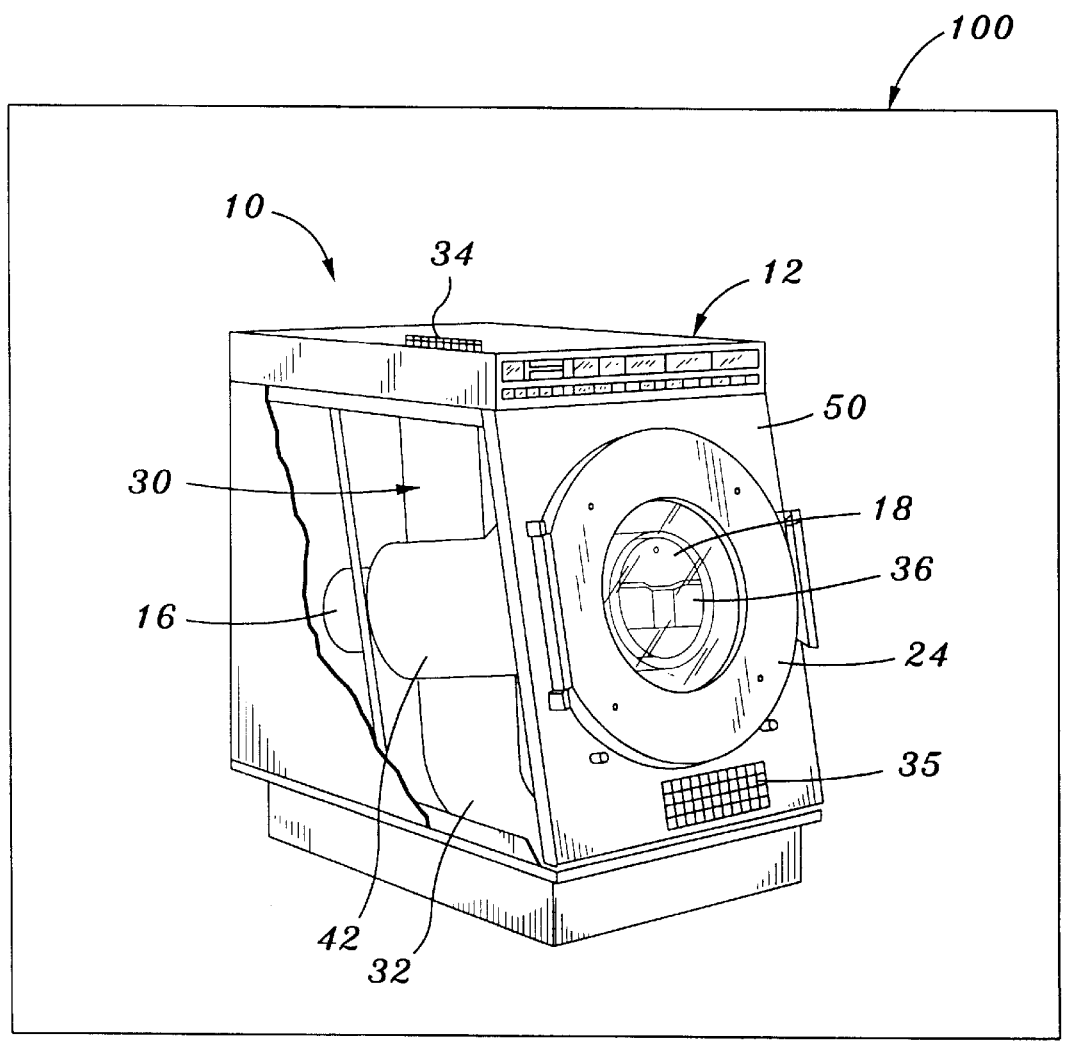
FIG. 1 is a perspective view of the present centrifugal processor.

Turning now in detail to the drawings, as shown in FIG. 1, the present centrifugal processor 10 includes a cylindrical rotor housing 42 within a processor housing 12. A cassette rotor 18 is rotatably mounted within the rotor housing 42 and is driven by a motor 16. An inlet opening 34 on the top or side of the processor housing 12 leads into an inlet duct 30 connecting to the top of the rotor housing 42. An outlet duct 32 extends from the bottom or side of the rotor housing 42, to an outlet opening 35 on the front or side of the processor housing 12.

A tray or cassette 36 carrying silicon (or other flat media material) wafers 38 is placed into and removed from the rotor 18 via swing out door 24 on the processor housing 12.

Figure 2:
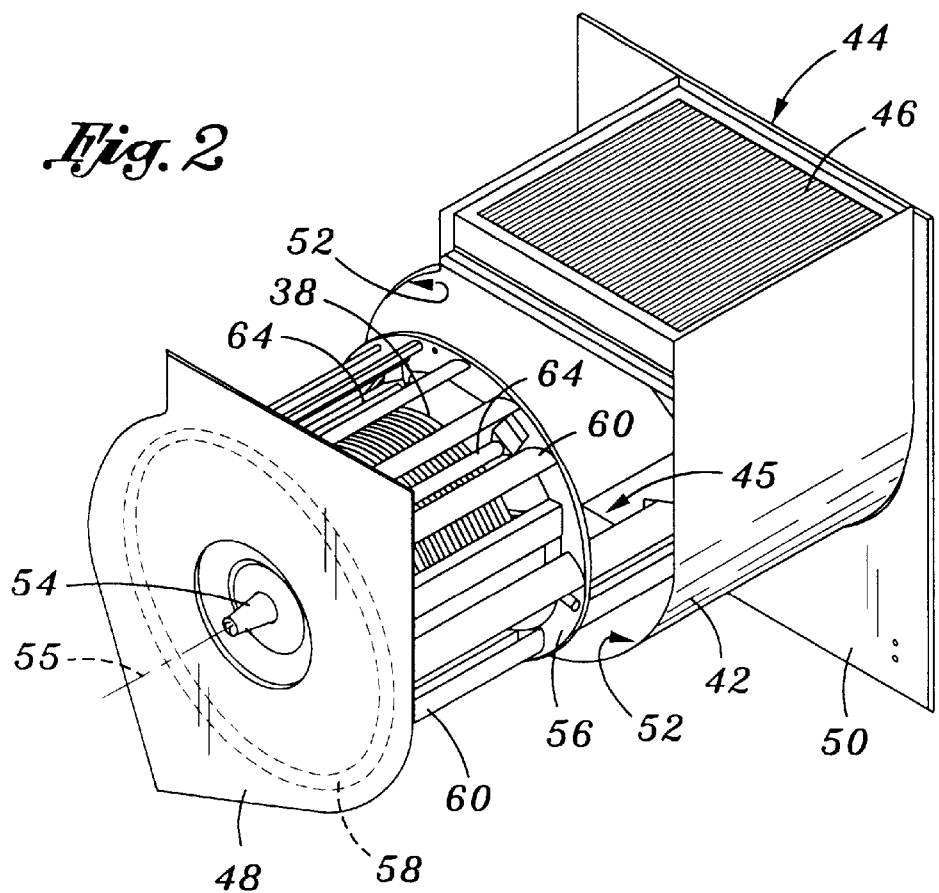
FIG. 2 is a back, top and left side exploded perspective view of the rotor and rotor housing of the centrifugal processor shown in FIG. 1.
Figure 3:
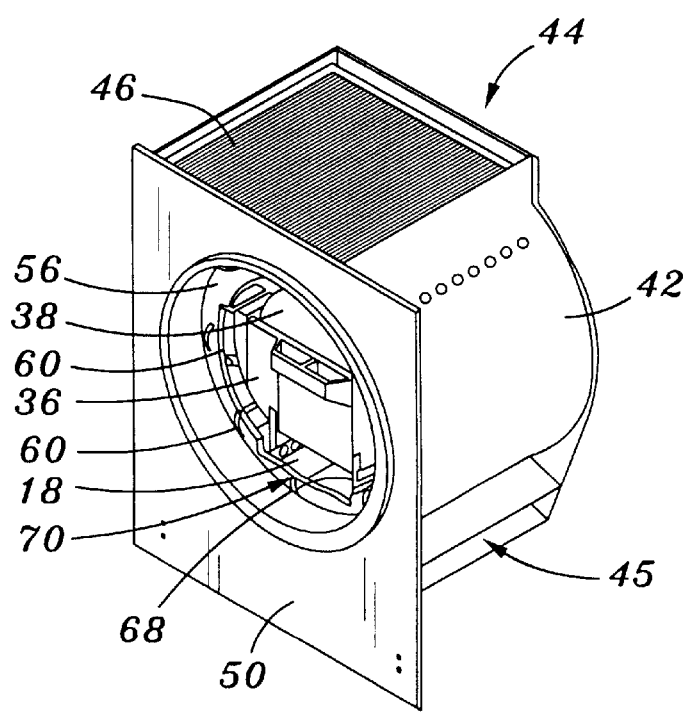
FIG. 3 is a front, top and right side perspective view of the rotor housing shown in FIG. 2.
Figure 4:
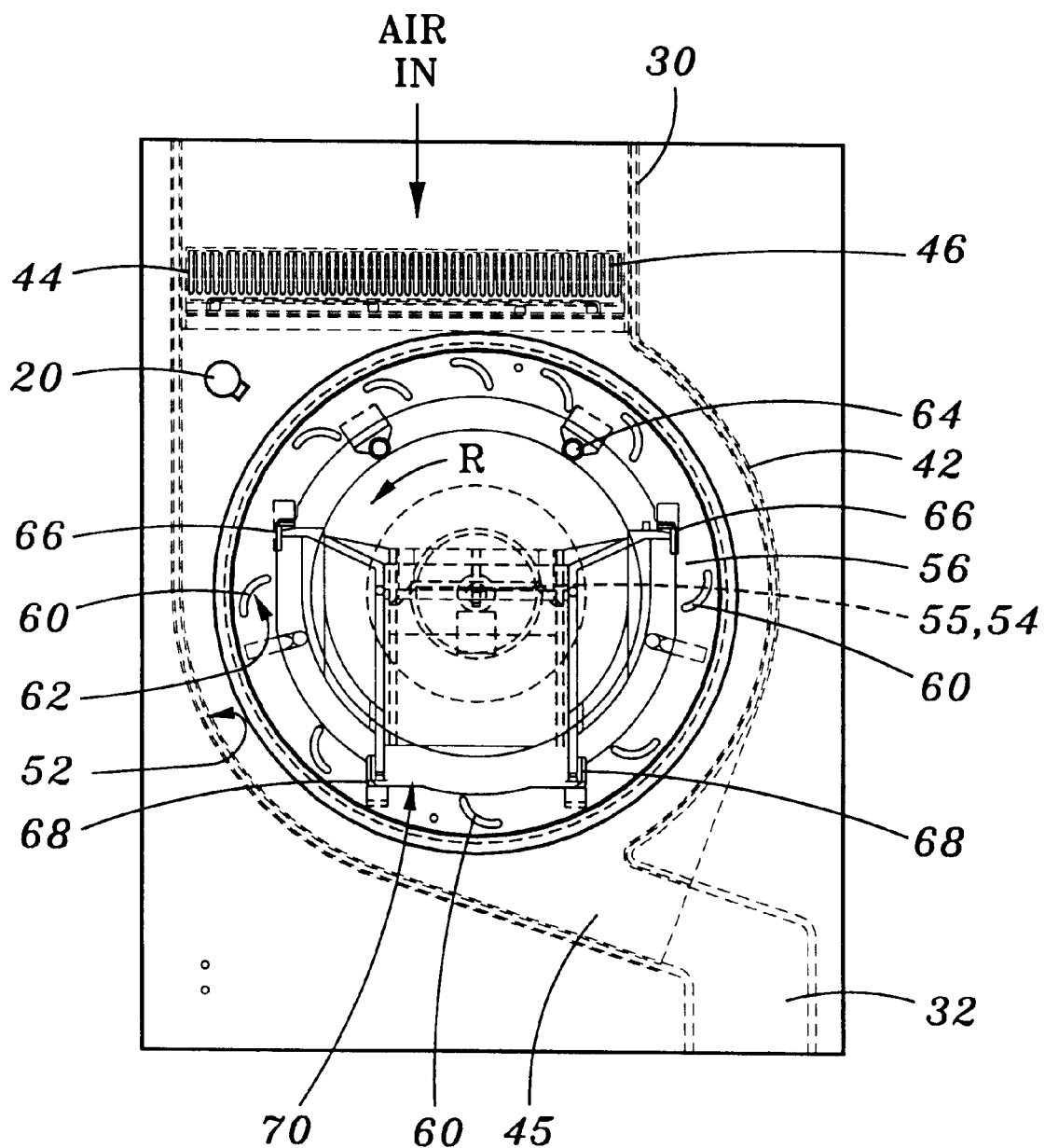
FIG. 4 is a front elevation view of the rotor and rotor housing shown in FIGS. 2 and 3.

Referring to FIGS. 2, 3 and 4, the rotor housing 42 has a rotor housing inlet 44, preferably at the top, and a rotor housing outlet 45, near the bottom, or on one side of the rotor housing. The inlet duct 30 in the processor housing 12 joins the rotor housing inlet 44, and the rotor housing outlet 45 connects with the outlet duct 32 in the processor housing 12, as shown in FIG. 4. A filter 46 is supported in the rotor housing inlet 44.

The rotor housing 42, as shown in FIGS. 2 and 3, preferably has a front plate 50, and a back plate 48 integrally joined to cylindrical walls 52. The front plate 50 may also serve as the front panel of the processor housing 12. The rotor housing 42 replaces the bowl or process chamber typically used in existing spin rinser dryers, spray solvent machines, spray acid machines, and other centrifugal processors.

The cassette rotor 18 includes a cassette holder 70 having upper and lower left and right cassette supports 66 and 68 extending between front and back rings 56 and 58. Wafer posts 64 also extend between the rings 56 and 58 to restrain the wafers.

As shown in FIGS. 2 and 4, fan or blower blades 60 are attached to the front and back rings 56 and 58 around the outside of the cassette or wafer holder 70. The blades 60 are provided in a pattern to provide clearance for the supports 66 and 68 which form the cassette or wafer holder 70. Weights may be selectively added to balance the rotor. The blades 60 have a concave leading surface 62. The entire rotor 18 is supported on a rotor axle 54 extending through the back plate 48 and attached to the drive motor 16.

A spray manifold 20, for spraying e.g., de-ionized water, solvents, acids, gases, etc. may be provided, parallel to the rotor 18 within the rotor housing, as shown in FIG. 4.

Figure 5:
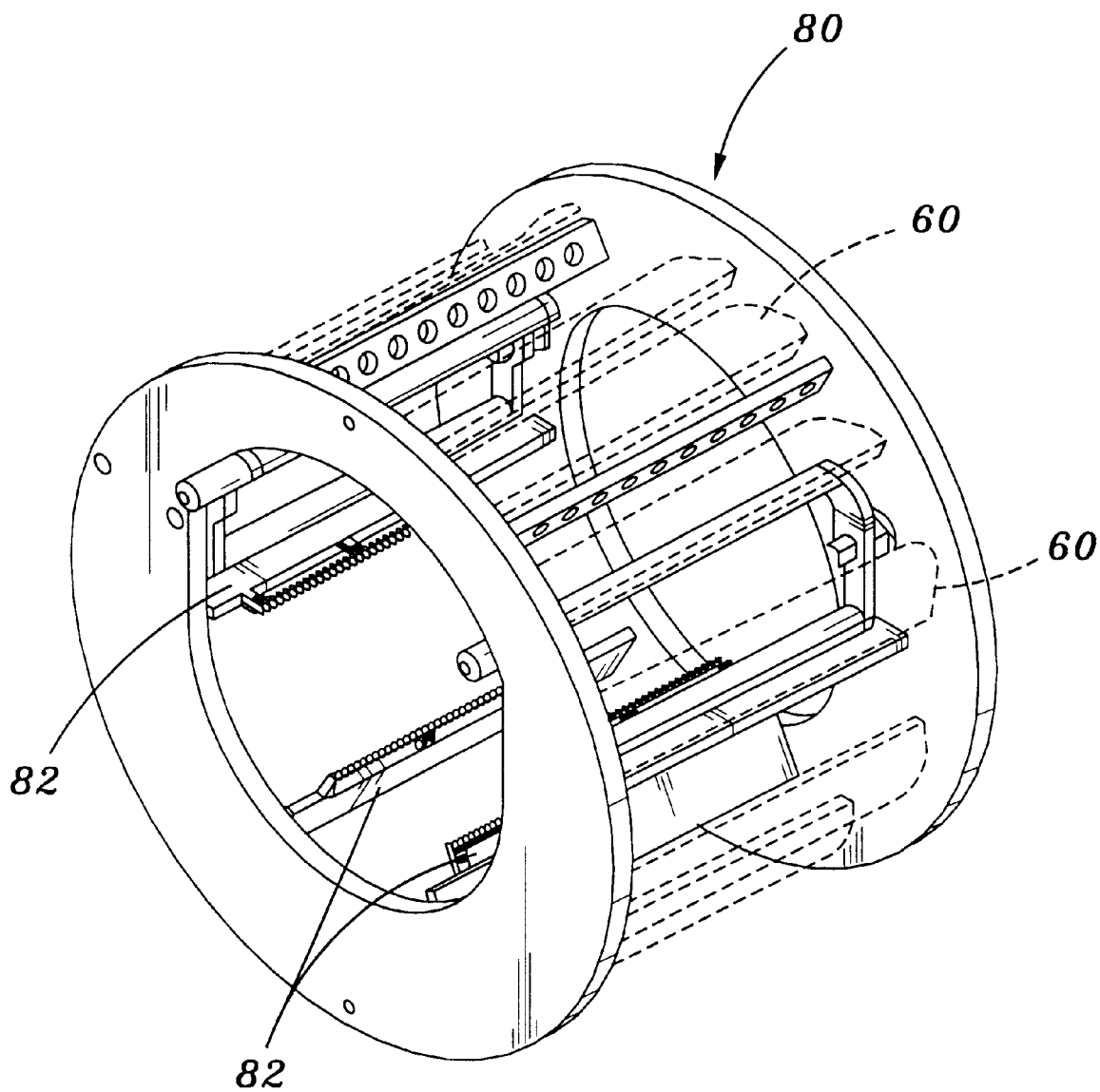
FIG. 5 is a perspective view of a second embodiment of the invention.

In an alternative embodiment, a comb rotor 80 has combs 82 for holding the wafers 38 directly, rather than holding a cassette 36. As shown in FIG. 5 the combs 82 are attached to the rotor 82, along with the blades 60 (shown in phantom lines in FIG. 5). The designs for holding wafers directly in combs in a rotor, or for holding a cassette carrying wafers in a rotor, are well known, as described, for example in U.S. Pat. Nos. 5,664,337 and 5,232,328, incorporated herein by reference.

In use, the centrifugal processor 10 is installed in a clean room 100, typically along with other semiconductor manufacturing equipment. Air supplied to the clean room 100 is filtered to remove particles which may interfere with the manufacturing processes.

Wafers or other flat media 38 loaded into a tray or cassette 36 are placed into the cassette holder 70 of the rotor 18, via the door 24. If no cassette is used, the wafers are placed directly onto the combs 82 of the rotor 80. The motor 16 spins the rotor 18 or 80 containing the wafers, in the direction R in FIG. 4. Liquids and/or gases are sprayed onto the wafers 38 by the manifold 20, through the blades 60 on the spinning rotor. Additional manifolds may also be provided, to spray other fluids or gases.

After the wafers 38 have been sufficiently rinsed, the rotor 18 or 80 is accelerated up to a drying speed, of about 2,000 rpm. The spinning blades 60 draw air into the rotor housing 42 via the inlet opening 34 and inlet duct 30. Some of the air is blown through the wafers 38, displacing fluid droplets which may remain near the center of the wafers. After the fluid droplets are displaced from the wafer centers, centrifugal force flings the droplets outwardly, thereby removing the droplets from the wafers or flat media 38.

As shown in FIG. 4, the cylindrical wall 52 of the rotor housing 42 closely surrounds the spinning rotor 18 or 80, and is preferably spaced apart from the rotor by 5–40 millimeters. The rotor 18 or 80 and rotor housing 42 together create an air blower movement, driving air through the rotor housing 42 and over the wafers 38, including the central areas of the wafers. Exhaust air moves out of the rotor housing 42 through the rotor housing outlet 45 and the outlet duct 32. Fluid droplets and airborne particles are collected or filtered in the outlet duct 32, with the air then returned into the clean room 100. The centrifugal processor 10 accordingly dries the wafers 38 without spotting in the wafer centers, and without using costly dry nitrogen gas.

In the design shown in the drawings, the rotor housing 42 has a volume of about 1 cubic foot. With the rotor 18 or 80 spinning at about 2,000 rpm, about 50 cubic feet per minute of clean room air is blown through the rotor housing 42. The rotor housing inlet 44 and rotor housing outlet 45 are preferably on opposite sides of the rotor 18 or 80, or at least spaced apart, to create a cross flow effect of air moving past the wafers 38. The blades 60 are preferably blower type blades having a concave inner surface, although various alternative blade designs may be used. The rotor is mounted so that the spin axis of the rotor is preferably in the range of 5° to 35° or 5° to 85°, for example, at 10°, up from horizontal.

The invention may be used in connection with spin rinser dryers, spray solvent machines, spray acid machines, and other centrifugal processors. The invention may be used to process all types of flat media, including semiconductor wafers, e.g., silicon wafers, photomasks, flat panels, lenses, etc.

Thus, a novel cross flow centrifugal processor has been shown and described. Various modifications may of course be made without departing from the spirit and scope of the invention. The invention, therefore, should not be limited, except to the following claims and their equivalents.

I claim:

1. A centrifugal processor, comprising:
    a rotor housing;
    a rotor rotatably mounted within the rotor housing;
    a flat media holder; and
    a plurality of fan blades positioned on the rotor to blow ambient gas within the rotor housing, over the flat media.

2. The centrifugal processor of claim 1 wherein the flat media holder is a cassette holder.

3. The centrifugal processor of claim 2 further comprising means for spinning the rotor about a spin axis, and semiconductor material wafers held in a cassette in the cassette holder, with the wafers centered on the spin axis.

4. The centrifugal processor of claim 1 further comprising an inlet attached near an upper end of the rotor housing and an outlet attached near a lower end of the rotor housing.

5. The centrifugal processor of claim 4 further comprising a source of clean room air leading into the inlet duct.

6. The centrifugal processor of claim 4 further comprising a processor housing having a top and a bottom and containing the rotor housing and having an inlet duct extending from near the top of the processor housing to the inlet of the rotor housing and an outlet duct extending from the outlet of the rotor housing to near the bottom of the processor housing.

7. The centrifugal processor of claim 1 wherein the rotor is rotatable about a spin axis, and the fan blades extend parallel to the spin axis.

8. The centrifugal processor of claim 1 wherein the rotor and rotor housing are generally cylindrical, and the rotor is centered within the rotor housing.

9. The centrifugal processor of claim 8 wherein the rotor housing has an interior cylindrical wall spaced apart from the rotor by 5–40 mm.

10. The centrifugal processor of claim 1 further comprising a filter in a rotor housing inlet on the rotor housing.

11. The centrifugal processor of claim 1 wherein the rotor comprises a front ring and a back ring and the fan blades extend perpendicularly between the front ring and the back ring.

12. The centrifugal processor of claim 1 wherein the blades have a concave surface facing the flat media holder.

13. The centrifugal processor of claim 1 wherein the rotor housing has an open front end and a closed back end.

14. The centrifugal processor of claim 1 further comprising a spray manifold adjacent to the rotor, for spraying water, solvent or acid towards the rotor.

15. A method for processing flat media, comprising the steps of:
    loading the flat media into a centrifugal processor in a clean room;
    drawing clean room air into the centrifugal processor;
    blowing the clean room air over the flat media; and
    blowing the clean room air back into the clean room.

16. The method of claim 15 further comprising the step of spinning a rotor inside the dryer carrying the flat media, to blow the clean room air over the wafers.

17. A centrifugal processor, comprising:
    a processor housing;
    a rotor housing within the processor housing;
    a rotor within the rotor housing and rotatable mounted therein about a rotational axis;
    holding means, within the rotor, for holding a plurality of flat media;
    air moving means on the rotor for blowing air over the flat media with rotation of the rotor; and
    means for rotating the rotor about the rotational axis.

18. The centrifugal processor of claim 17 wherein the flat media are silicon wafers.

19. A centrifugal processor, comprising:
    a rotor housing;
    a rotor rotatably mounted within the rotor housing;
    a flat media holder within the rotor for holding an array of flat media in a fixed upright position; and
    a plurality of fan blades positioned on the rotor to blow ambient gas within the rotor housing over flat media held in the flat media holder.

20. The processor of claim 19 wherein the rotor and any flat media in the rotor have a spin axis extending upwardly at 5–35° from horizontal.

21. A centrifugal processor, comprising:
    a rotor housing;
    a rotor rotatably mounted within the rotor housing;
    a flat media holder within the rotor;
    a plurality of fan blades on the rotor; and
    a filter in a rotor housing inlet on the rotor housing.

22. A centrifugal processor, comprising:
    a rotor housing;
    a rotor rotatably mounted within the rotor housing;
    a flat media holder within the rotor;
    an inlet attached near an upper end of the rotor housing and an outlet attached near a lower end of the rotor housing;
    a source of clean room air leading into the inlet; and
    a plurality of fan blades on the rotor.

23. A centrifugal processor, comprising:
    a rotor housing;
    a rotor rotatably mounted within the rotor housing;
    a flat media holder within the rotor; and
    a plurality of fan blades on the rotor positioned to blow air over both sides of the flat media.

* * * * *